United States Patent
Kim et al.

(10) Patent No.: US 11,095,310 B2
(45) Date of Patent: Aug. 17, 2021

(54) ERROR CORRECTION APPARATUS, OPERATION METHOD THEREOF AND MEMORY SYSTEM USING THE SAME

(71) Applicant: SK hynix Inc., Icheon-si (KR)

(72) Inventors: Dae Sung Kim, Icheon-si (KR); Won Gyu Shin, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/585,564

(22) Filed: Sep. 27, 2019

(65) Prior Publication Data

US 2020/0210292 A1 Jul. 2, 2020

(30) Foreign Application Priority Data

Dec. 26, 2018 (KR) .......................... 10-2018-0169391

(51) Int. Cl.
*H03M 13/15* (2006.01)
*G06F 11/10* (2006.01)

(52) U.S. Cl.
CPC ..... *H03M 13/1575* (2013.01); *G06F 11/1076* (2013.01)

(58) Field of Classification Search
CPC ......... H03M 13/1575; H03M 13/2927; H03M 13/13; H03M 13/152; H03M 13/153; H03M 13/1515; H03M 13/1545; G11C 29/42; G11C 29/52
See application file for complete search history.

(56) References Cited

U.S. PATENT DOCUMENTS

| 9,003,269 | B2* | 4/2015 | Oshiyama | H03M 13/2927 |
| | | | | 714/785 |
| 2009/0217140 | A1* | 8/2009 | Jo | H03M 13/3715 |
| | | | | 714/785 |
| 2015/0007001 | A1* | 1/2015 | Kern | H03M 13/616 |
| | | | | 714/785 |
| 2017/0264320 | A1* | 9/2017 | Lin | H03M 13/1545 |

FOREIGN PATENT DOCUMENTS

KR 10-2008-0101911 11/2008

* cited by examiner

*Primary Examiner* — Shelly A Chase
(74) *Attorney, Agent, or Firm* — Perkins Coie LLP

(57) ABSTRACT

An error correction apparatus may include: an input component configured to receive data; an error information generation component having a first error detection ability to detect L errors and a second error detection ability to detect K errors, where L is a positive integer and K is an integer larger than L, and configured to generate error information including the number of errors contained in the received data and the positions of the errors, based on the first error detection ability, and generate the error information based on the second error detection ability, when the error information is not generated on the basis of the first error detection ability; an error correction component configured to correct the errors of the received data based on the generated error information; and an output component configured to output the corrected data.

20 Claims, 9 Drawing Sheets

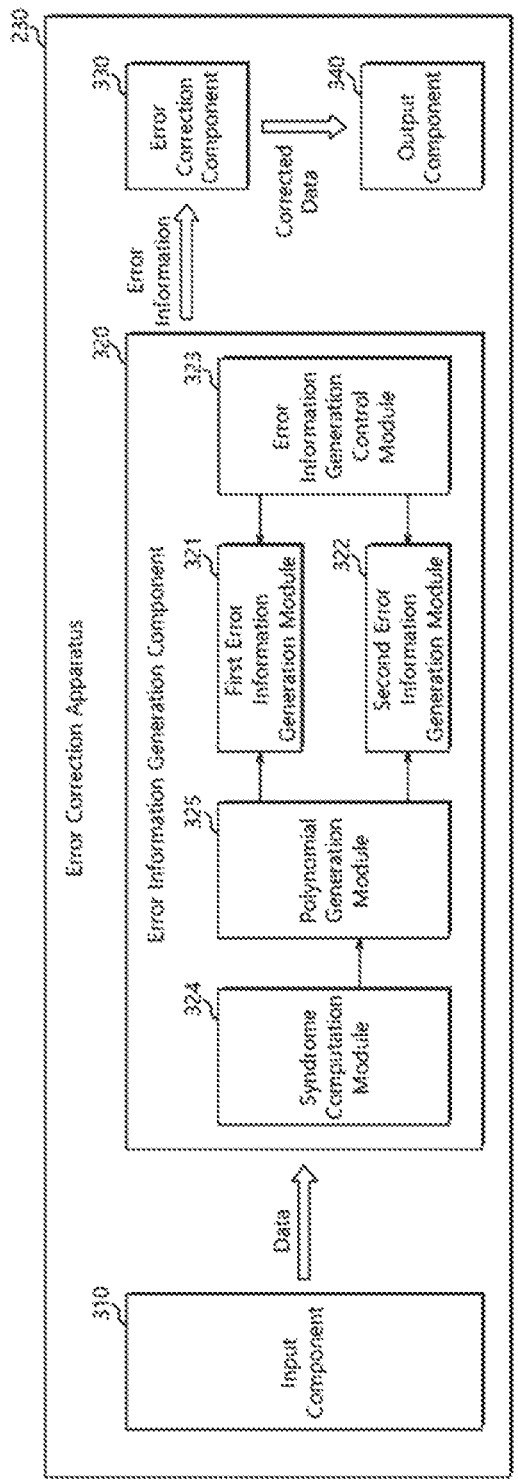

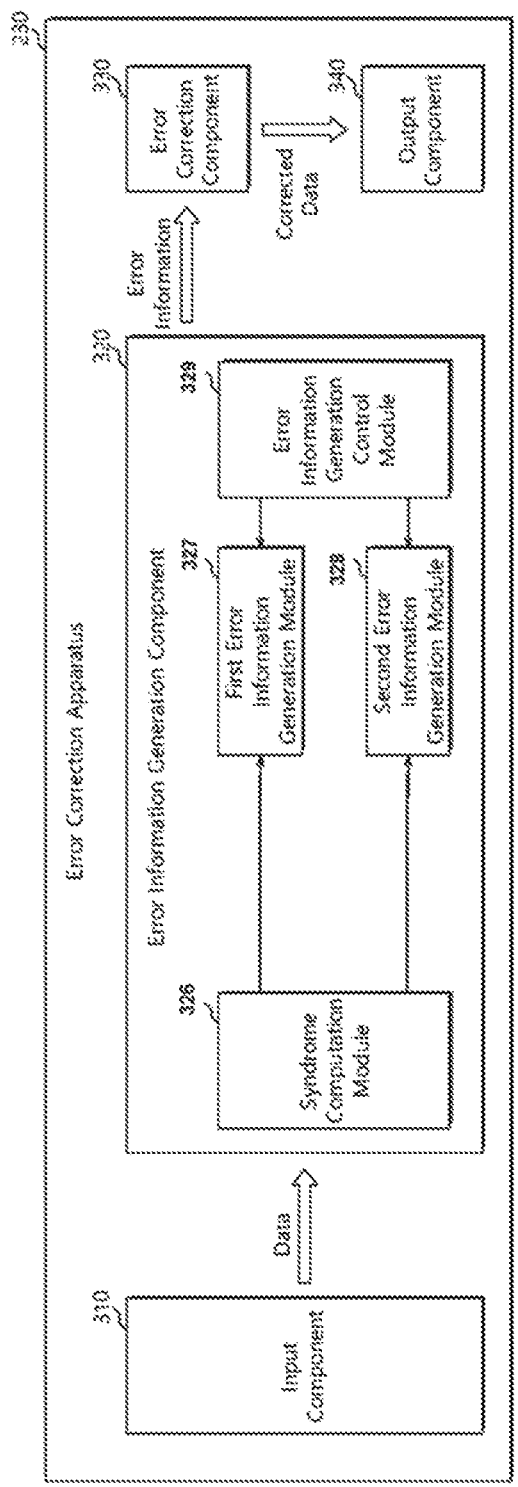

ERROR CORRECTION APPARATUS, OPERATION METHOD THEREOF AND MEMORY SYSTEM USING THE SAME

CROSS-REFERENCE TO RELATED APPLICATION

This patent document claims the priority and benefits of Korean Patent Application No. 10-2018-0169391 filed on Dec. 26, 2018, which is incorporated herein by reference in its entirety.

TECHNICAL FIELD

The technology and implementations disclosed in this patent document relate to an error correction apparatus, an operation method thereof and a memory system using the same, and more particularly.

BACKGROUND

In general, a memory device may be divided into a volatile memory, which loses its data over time or when power is removed, and a nonvolatile memory, which retains its data even when power is removed. A data processing system or a data storage system including such a memory device also includes or is in communication with a controller that manages the flow of data going to or from the memory device according to a request (e.g., write, read or erase request) from another device such as a host device. The controller may include error correction circuity to correct errors that are introduced into data stored in the memory device or have occurred during a process of reading stored data from the memory device. However, since an error correction ability of the controller has a trade-off relationship with the performance of the data processing system or the data storage system, the error correction ability can be limited.

SUMMARY

The technology disclosed in this patent document can be implemented in various embodiments to provide an error correction technique for improving the reliability of data and the efficiency of error correction.

In an embodiment, an error correction apparatus may include: an input component configured to receive data; an error information generation component having a first error detection ability to detect L errors and a second error detection ability to detect K errors, where L is a positive integer and K is an integer larger than L, and configured to generate error information including the number of errors contained in the received data and the positions of the errors, based on the first error detection ability, and generate the error information based on the second error detection ability, when the error information is not generated on the basis of the first error detection ability; an error correction component configured to correct the errors of the received data based on the generated error information; and an output component configured to output the corrected data.

In an embodiment, an error correction method may include the steps of: receiving data; generating error information including the number of errors contained in the received data and the positions of the errors based on a first error detection ability to detect L errors, and generating the error information based on a second error detection ability to detect K errors, when the error information is not generated on the basis of the first error detection ability, where L is a positive integer and K is an integer larger than L; correcting the errors of the received data based on the generated error information; and outputting the corrected data.

In an embodiment, a memory system may include: a memory device configured to store data therein according to a write command and output the data stored therein according to a read command; and a controller configured to control the operation of the memory device. The controller may include: a memory interface configured to receive read data corresponding to a read request of a host from the memory device; a data buffer configured to temporarily store the read data received through the memory interface and corrected data obtained by correcting the read data; an error correction apparatus having a first error detection ability to detect L errors and a second error detection ability to detect K errors, where L is a positive integer and K is an integer larger than L, and configured to generate error information including the number of errors contained in the read data stored in the data buffer and the positions of the errors, based on the first error detection ability, generate the error information based on the second error detection ability when the error information is not generated on the basis of the first error detection ability, correct the errors of the read data stored in the data buffer based on the generated error information, and temporarily store the corrected read data in the data buffer; and a host interface configured to transfer the read data temporarily stored in the data buffer to the host.

In an embodiment, a memory system may include: a semiconductor memory system comprising: a memory cell array including a plurality of memory cells to store data; and a controller in communication with the memory cell array and configured to detect one or more erroneous symbols in the data using more than one error detection algorithms that operate simultaneously on the data, including a first error detection algorithm having a first error detection ability, and a second error detection algorithm having a second error detection ability capable of detecting more erroneous symbols than the first error detection algorithm. The second error detection algorithm is configured to terminate its operations for the detection of the one or more erroneous symbols upon detection of the one or more erroneous symbols by the first error detection algorithm in conformance with the first error detection ability.

In an embodiment, the first error detection algorithm is configured to detect the one or more erroneous symbols based on a parity check matrix obtained from the data.

In an embodiment, the first error detection algorithm includes the Peterson algorithm.

In an embodiment, the second error detection algorithm determines an error locator polynomial and finds the roots of the error locator polynomial.

In an embodiment, the second error detection algorithm includes Berlekamp-Massey algorithm and Chien search.

In an embodiment, the controller is further configured to correct the detected one or more erroneous symbols.

In an embodiment, a semiconductor memory system including a memory cell array and a controller in communication with the memory cell array to read data from the memory cell array, the controller includes a syndrome generator to calculate a plurality of syndromes for the data, a first error detection algorithm having a first error detection ability to detect one or more erroneous symbols in the data, a second error detection algorithm having a second error detection ability capable of detecting more erroneous symbols than the first error detection algorithm to detect erroneous symbols in the data; and a comparator in communication with the syndrome generator and configured to compare the plurality of syndromes to check whether the plurality of syndromes satisfies a condition for termination of the second error detection algorithm. The first and second error detection algorithms operate in parallel on the data.

In an embodiment, the first error detection algorithm is configured to detect the one or more erroneous symbols based on a parity check matrix obtained from the plurality of syndromes.

In an embodiment, the second error detection algorithm includes Bose, Chaudhri, Hocquenghem (BCH) codes, and wherein the condition for termination of the second error detection algorithm includes designating a column of the parity check matrix as a syndrome.

In an embodiment, the second error detection algorithm includes Reed-Solomon (RS) code, and wherein the condition for termination of the second error detection algorithm includes a sequence of powers of the syndromes that forms an arithmetic progression.

In an embodiment, the first error detection algorithm includes Peterson algorithm.

In an embodiment, the second error detection algorithm determines an error locator polynomial.

In an embodiment, the determination of the error locator polynomial is carried out in parallel with operations of the first error detection algorithm.

In an embodiment, the second error detection algorithm includes determining an error locator polynomial and finding the roots of the error locator polynomial.

In an embodiment, the first error detection algorithm and the finding of the roots of the error locator polynomial proceed in parallel.

In an embodiment, a semiconductor memory system including a memory cell array and a controller in communication with the memory cell array to read data from the memory cell array, the controller includes a syndrome generator to calculate a plurality of syndromes for the data, a first error detection algorithm to detect a single-symbol error or up to a double-symbol error in the data, a second error detection algorithm to detect erroneous symbols in the data in parallel with the first error detection algorithm using a cyclic code and a comparator in communication with the syndrome generator and configured to compare the plurality of syndromes to check whether the plurality of syndromes satisfies a condition for termination of the second error detection algorithm.

In an embodiment, the first error detection algorithm is configured to detect the single-symbol error or the double-symbol error in the data based on a parity check matrix obtained from the plurality of syndromes or the Peterson algorithm.

In an embodiment, the second error detection algorithm includes Bose, Chaudhri, Hocquenghem (BCH) codes, and wherein the condition for termination of the second error detection algorithm includes finding the single-symbol error based on a sequence of powers of the syndromes that forms an arithmetic progression.

In an embodiment, the second error detection algorithm includes Bose, Chaudhri, Hocquenghem (BCH) codes, and wherein the condition for termination of the second error detection algorithm includes finding the double-symbol error based on a sum of two distinct column of a parity check matrix obtained from the plurality of syndromes.

In an embodiment, the second error detection algorithm includes Reed-Solomon (RS) code, and wherein the condition for termination of the second error detection algorithm includes finding the single-symbol error based on an arithmetic progression of powers of the syndromes that are in a column of a parity check matrix and finding the double-symbol error based on arithmetic progressions of powers of the syndromes that are in two columns of a parity check matrix.

BRIEF DESCRIPTION OF THE DRAWINGS

FIGS. 3A and 3B are block diagrams illustrating error correction apparatuses based on some embodiments of the disclosed technology.

DETAILED DESCRIPTION

Figure 1:
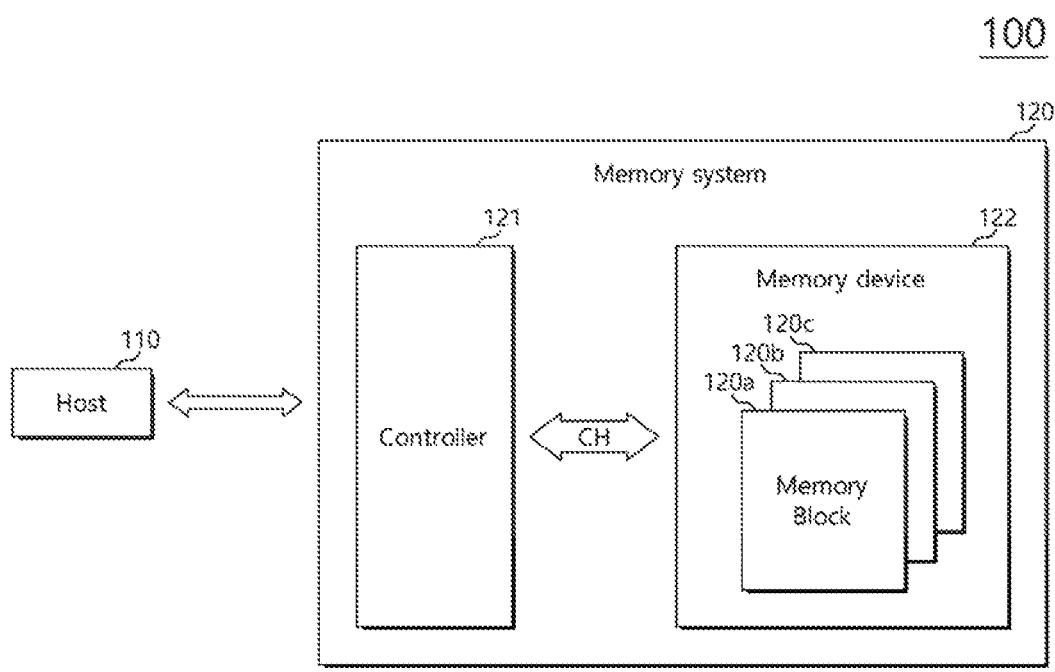
FIG. 1 is a configuration diagram illustrating a data processing system based on an embodiment.

The technology disclosed in this patent document can be implemented in embodiments to provide a storage device that includes two or more error correction algorithms with different error correction capabilities FIG. 1 is a configuration diagram illustrating a data processing system based on an embodiment of the disclosed technology.

Referring to FIG. 1, the data processing system 100 based on the present embodiment may include a host 110 and a memory system 120.

The host 110 may request the memory system 120 to perform all operations required for processing data, for example, write, read and erase operations, and receive the results from the memory system 120.

The host 110 may include wired/wireless electronic devices such as a portable electronic device, a desktop computer, a game machine, a TV and a projector, the portable electronic device including a mobile phone, an MP3 player, a laptop computer and the like. Furthermore, the host 110 may include one or more operating systems (OS) (e.g., Windows, Chrome and Linux) that provide functions and operations corresponding to the intended use of the data processing system and the purpose of a user who uses the data processing system. The host 110 and the associated discussion thereof are provided to illustrate some embodiments of the disclosed technology by way of example, not by limitation. Therefore, the host 100 can be any device capable of communicating information with the memory system 120.

The memory system 120 may perform an operation according to a request of the host 110 and all operations required for maintaining the memory system 120. The memory system 120 may include a controller 121 configured to control overall operations of the memory system 120, and a memory device 122 configured to perform an operation based on a control command of the controller 121 and all operations required for maintaining the memory system 120. The controller 121 and the memory device 122 may be coupled to each other through a channel CH. The controller 121 and the memory device 122 will be described below in detail with reference to FIGS. 2 to 12.

The memory system 120 may correct erroneous data. As a specific example, the memory system 120 may receive data from the host 110, detect errors contained in data which are processed in the memory system 120 like a read operation for data stored in the memory device 122, and correct the detected errors. The memory system 120 may detect the errors by applying different error detection abilities according to the errors contained in the data. The error detection ability may indicate the maximum number of detectable errors. That is, when the error detection ability is 4, the memory system 120 may detect erroneous data including a maximum of four errors. This configuration will be described below in detail with reference to FIGS. 3A to 9.

The memory system 120 may be configured as a PCM-CIA (Personal Computer Memory Card International Association) card, CF (Compact Flash) card, smart media card, memory stick, various multimedia cards (MMC) such as an eMMC, RS-MMC and MMC-micro, secure digital (SD) card such as an mini-SD or micro-SD, UFS (Universal Flash Storage), SSD (Solid State Drive) or the like.

Since the above-described configuration is only an example for promoting understanding of the memory system 120, it is obvious that the memory system 120 based on the present embodiment is not limited thereto.

Figure 2:
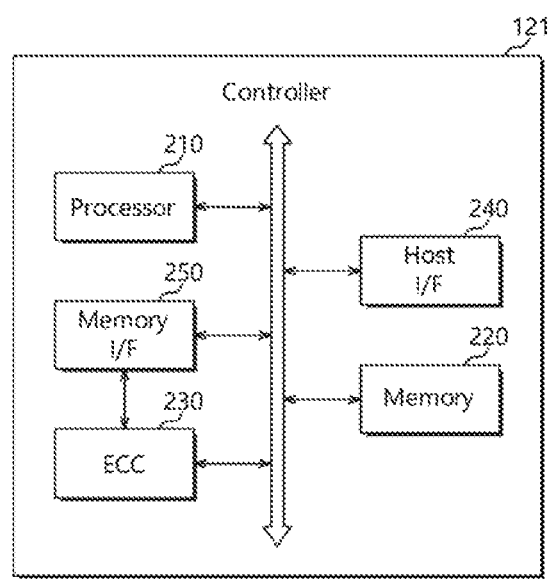
FIG. 2 is a block diagram illustrating a controller based on an embodiment of the disclosed technology.

FIG. 2 is a block diagram illustrating a controller based on an embodiment of the disclosed technology.

Referring to FIG. 2, the controller 121 based on the present embodiment may include a processor 210, a memory 220, an error correction apparatus 230, a host interface (I/F) 240, a memory I/F 250 and a power management component (PMU) 260.

The processor 210 may control overall operations of the memory system 120. As a specific example, when a request such as a write, read or erase request is received from the host 110, the processor 210 may control memory components of the controller 121 and operations of the memory device 122 to perform an operation corresponding to the received request.

In an embodiment, the processor 210 may execute firmware-level codes to control overall operations of the memory system 120. There can be a flash translation layer (FTL) in the memory system 120 to perform different translations between the host 110 and the memory device 122. Examples of tasks the FTL performs can include logical block mapping, wear leveling, and garbage collection.

In an embodiment, the processor 210 may be implemented as a microprocessor or central processing component (CPU).

The memory 220 may serve as a working memory of the controller 121, the memory device 122 and the like. The memory 220 may store instructions to be executed by the controller 121 and the memory device 122. The memory 220 may serve as a working memory that stores data required for driving the memory system 120, the controller 121 and the like. As a specific example, the memory 220 may store data received from the memory device 122 into the host 110, in order to perform an operation requested from the host 110, such as a write, read or erase operation. For this operation, the memory 220 may be configured as a program memory, data memory, write buffer/cache, read buffer/cache, data buffer/cache, map buffer/cache or the like.

In an embodiment, the memory 220 may be implemented as a volatile memory. For example, the memory 220 may be implemented as an SRAM (Static Random Access Memory), DRAM (Dynamic Random Access Memory), ROM (Read Only Memory), MROM (Mask ROM), PROM (Programmable ROM), EPROM (Erasable ROM), EEPROM (Electrically Programmable ROM), PCRAM (Phase-Change Random Access Memory), FRAM (Ferroelectric RAM), PRAM (Phase change RAM), MRAM (Magnetic RAM), RRAM (Resistive RAM), or flash memory (for example, NAND Flash).

The error correction apparatus 230 may correct erroneous data processed in the memory system 120.

In an embodiment, the error correction apparatus 230 may include an ECC (Error Correction Code) encoder and an ECC decoder which are not illustrated. The ECC encoder may perform error correction encoding on data to be stored in the memory device 122 during a write operation, and the ECC decoder may perform error correction decoding on data received from the memory device 122 during a read operation. The ECC encoder may generate a parity bit by performing error correction encoding on data to be stored in the memory device 122, and add the generated parity bit to the data to be stored in the memory device 122. The memory device 122 may store the data with the parity bit therein. The ECC decoder may detect an error by performing error correction decoding on data received from the memory device 122 based on the parity bit, and correct the detected error. When the number of error bits contained in the detected error exceeds the limit of the error correction ability or error detection ability of the ECC decoder, the ECC decoder cannot correct the detected error, and thus may output an error correction fail signal.

The error correction codes (ECC) are used in NAND Flash memories to detect and correct bit errors. With increasing memory complexity, bit error rates continue to grow. For memory devices that store more than one bit per memory cell, this issue has become even more critical. The bit errors can be caused by many things. By way of example and not by limitation, the bit errors can be caused by overlapping threshold voltage windows of the memory cells. For n-bit multi-level cell NAND flash memory, the threshold voltage of each cell can be programmed to 2n possible values. In an ideal multi-level cell NAND flash memory, each value corresponds to a non-overlapping threshold voltage window. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using the ECC. There are many other causes of bit errors (e.g., cell-to-cell interference, program/erase cycle, etc.), and they can also be managed by using the ECC.

In an embodiment, the error correction apparatus 230 may perform hard decision and soft decision on data received from the memory device 122. The hard decision may indicate a method for correcting erroneous the data received from the memory device 122 by using only error correction codes and data which are read according to the on/off characteristics of memory cells when a predetermined reference read voltage is applied. Hereafter, the data will be referred to as hard decision data. The soft decision may indicate a method for correcting the erroneous data received from the memory device 122 by additionally using additional information on the reliability of the hard decision data as well as the hard decision data and the error correction codes. The additional information will be referred to as reliability data. The error correction apparatus 230 may perform both or any one of the hard decision and the soft decision on the data received from the memory device 122. When errors are not corrected through the hard decision performed on the data received from the memory device 122, the error correction apparatus 230 may perform the soft decision.

In an embodiment, the error correction apparatus 230 may correct the erroneous the data received from the memory device 122, using an LDPC (low density parity check) code, BCH (Bose, Chaudhri, Hocquenghem) code, turbo code, Reed-Solomon code, convolution code, RSC (recursive systematic code), or coded modulation such as TCM (trellis-coded modulation) or BCM (Block coded modulation).

The error correction apparatus 230 may detect and correct a data corruption, which includes any unintentional change to a data bit. Such a data corruption is detected during a read operation and can be corrected up to the maximum capability of the code being used. Some memory controllers include an error correction algorithm that can detect and correct errors of a single bit per word (e.g., unit of bus transfer). Other memory controllers include an error correction algorithm that can detect (and correct) errors of two or more bits per word. In some embodiments of the disclosed technology, however, the error correction apparatus 230 include two or more error correction algorithms with different error detection and/or correction capabilities. For example, the error correction apparatus 230 may include first and second error correction algorithms. The first error detection (and correction) algorithm can have a first error detection (and correction) ability to detect (and correct) errors of one or more bits per word, and the second error detection (and correction) algorithm can have a second error detection (and correction) ability to detect (and correct) more error bits than the first error detection (and correction) algorithm. To put it another way, the first and second error detection (and correction) algorithms can have different maximum number of correctable error bits. For example, the first error detection (and correction) algorithm can detect (and correct) up to L bits of errors per word, and the second error detection (and correction) algorithm can detect (and correct) up to K bits of errors per word, where K is an integer larger than L. The error correction apparatus 230 may detect the location and number of error bits and correct the detected errors. Various implementations of the disclosed technology will be described below in detail with reference to FIGS. 3A to 9.

In an embodiment, given that data are coded with BCH codes, the error correction apparatus 230 may use Peterson algorithm, Berlekamp-Massey algorithm, and/or Euclid algorithm with or without others.

In an embodiment, given that data are coded with non-binary BCH codes or RS codes, the error correction apparatus 230 may use Peterson-Gorenstein-Zierler algorithm, Berlekamp-Massey algorithm and/or Euclid algorithm with or without others.

In an embodiment, given that data are coded with Gabildulin codes, the error correction apparatus 230 may use modified Berlekamp-Massey algorithm and/or Euclid algorithm.

In some embodiments of the disclosed technology, the error detection/correction decoding algorithm of the error correction apparatus 230 can be implemented as follows: (1) computation of the syndrome; (2) determination of an error locator polynomial; (3) finding the roots of the error locator polynomial; and (4) determine the error values (e.g., for Reed-Solomon codes or nonbinary BCH codes).

The host OF 240 may enable data communication between the memory system 120 and the host 110. As a specific example, the host I/F 240 may receive a request such as a write, read or erase request from the host 110, and transfer data corresponding to the received request to the host 110. For this operation, the host 110 may use a host interface layer (HIL).

In an embodiment, the host I/F 240 may be implemented as USB (Universal Serial Bus), MMC (Multi-Media Card), PCI-E (Peripheral Component Interconnect-Express), SAS (Serial-Attached SCSI), SATA (Serial Advanced Technology Attachment), PATA (Parallel Advanced Technology Attachment), SCSI (Small Computer System Interface), ESDI (Enhanced Small Disk Interface), IDE (Integrated Drive Electronics), MIPI (Mobile Industry Processor Interface) or the like, according to a communication protocol which is defined to transfer data to the host 110 or receive data from the host 110.

The memory I/F 250 may include a protocol for data communication between the controller 121 and the memory device 122. For example, the memory I/F 250 may be used to transfer, to the memory device 122, data including instructions for performing a write, read or erase operation, responsive to request received from the host 110 and other data required for maintaining the memory system 120. The memory I/F 250 may be used to receive corresponding data from the memory device 122. For this operation, the memory I/F 250 may use a flash interface layer (FIL).

The PMU 260 may be used to distribute electrical power to the memory system 120. As a specific example, the PMU 260 may receive power from a battery or an external device such as the host 110, and distribute the received power to operate the respective components of the memory system 120. Furthermore, the PMU 260 may include a capacitor or battery for storing power to normally operate the memory system 120 even in the absence of power due to an unexpected power loss such as a sudden power-off.

FIGS. 3A and 3B are block diagrams illustrating error correction apparatuses based on some embodiments of the disclosed technology.

Referring to FIGS. 3A and 3B, the error correction apparatus 230 based on an embodiment of the disclosed technology may include an input component 310, an error information generation component 320, an error correction component 330 and an output component 340.

The input component 310 may receive data that is targeted to be error-detected and error-corrected. As a specific example, data received from the host and data received from the memory device are stored in a data buffer, and the input component 310 may receive, from the data buffer, the data targeted to be error-detected and error-corrected. The input component 310 may transfer the received data to the error information generation component 320.

In an embodiment, the input component 310 may receive data coded with linear block codes. For example, the input component 310 may receive data coded with BCH codes, non-binary BCH codes, RS codes or Gabildulin codes.

In an embodiment of the disclosed technology, as shown in FIG. 3A, the error information generation component 320 may generate error information by detecting error bits contained in the received data. For this operation, the error information generation component 320 may include a first error information generation module 321, a second error information generation module 322, an error information generation control module 323, a syndrome computation module 324 and a polynomial generation module 325. The error information may the number of error bits contained in data and the positions of the errors. In another embodiment of the disclosed technology, as shown in FIG. 3B, the error information generation component 320 may include a first error information generation module 327, a second error information generation module 328, an error information generation control module 329, and a syndrome computation module 326. In an implementation, the second error information generation module 328 may determine an error locator polynomial (e.g., Berlekamp-Massey algorithm) and/or may find the roots of the error locator polynomial (e.g., Chien search), and the first error information generation module 327 may detect error bits (and their location) by using the features of the parity check matrices. An error detection by the first error information generation module 327 and an error detection by the second error information generation module 328 proceed in parallel, and, upon detection of error bit(s) by the first error information generation module 327, the second error information generation module 328 terminates its error detection algorithm.

The first error information generation module 321 may generate first error information by using a first error correction ability, which can detect (and correct) up to L bits of errors per word where L is a positive integer. As a specific example, the first error information generation module 321 is capable of detecting L or less bits of errors per word, and may generate the first error information based on an error detection result that is obtained by using the first error correction ability. That is, the first error information generation module 321 may generate the first error information by applying the first error detection ability to the received data.

In an embodiment of the disclosed technology, the first error information generation module 321 may generate the first error information based on the Peterson algorithm.

In another embodiment of the disclosed technology, the first error information generation module 321 may generate the first error information regarding data containing one-bit error, based on column vector numbers of a parity check matrix. For example, when the received data (r) are coded with BCH codes and a parity check matrix H is configured as shown in matrix (1) below, the product of the parity check matrix and all codewords C may be defined as a zero vector as expressed by Equation (1) below.

$$\begin{bmatrix} 1 & \alpha & \alpha^2 & \alpha^3 & \ldots & \alpha^{n-1} \\ 1 & (\alpha^2) & (\alpha^2)^2 & (\alpha^2)^3 & \ldots & (\alpha^2)^{n-1} \\ 1 & (\alpha^3) & (\alpha^3)^2 & (\alpha^3)^3 & \ldots & (\alpha^3)^{n-1} \\ \vdots & & & & & \vdots \\ 1 & (\alpha^{2t}) & (\alpha^{2t})^2 & (\alpha^{2t})^3 & \ldots & (\alpha^{2t})^{n-1} \end{bmatrix} \quad \text{Matrix (1)}$$

$$H \cdot C = 0 \quad \text{Equation (1)}$$

Furthermore, as expressed by Equation (2) below, the received data (r) may be expressed as the sum of original data (c) and an error (e), and a syndrome computation result (S) for the received data (r) may be defined as the product of the parity check matrix (H) and the error (e).

$$S = H \cdot r = H \cdot (c+e) = H \cdot c + H \cdot e = H \cdot e \quad \text{Equation (2)}$$

Therefore, when one bit error (e.g., an error at a second bit) occurs in the received data (r), a syndrome computation result ($S_1$) may be corresponding to a column vector (e.g., second column vector), which is corresponding to an error ($e_1$) among the column vectors of the parity check matrix H, as expressed by Equation (3).

$$S_1 = H \cdot e_1 = H \cdot \begin{bmatrix} 0 \\ 1 \\ 0 \\ 0 \\ 0 \\ 0 \\ 0 \end{bmatrix} = \text{Second column vector of } H \quad \text{Equation (3)}$$

That is, the column vector number of the parity check matrix, corresponding to the syndrome computation result of the received data, may indicate the error position of the received data. As a result, the first error information generation module 321 may check the column vector number of the parity check matrix, corresponding to the syndrome computation result of the received data, and generate the first error information including the checked column vector number as the location of erroneous bit(s). In some embodiments of the disclosed technology, the first error information generation module 321 may identify the features (e.g., geometric ratios, whether sequence of power of syndrome forms arithmetic progression) of the column vectors included in the parity check matrix, thereby checking the column vector number of the parity check matrix, corresponding to the syndrome computation result of the received data.

In an embodiment, the first error information generation module 321 may generate the first error information regarding data with two or more bits of errors, based on the column vector numbers of the parity check matrix. For example, when two or more error bits (for example, errors at second and fourth bits) are contained in the received data (r), a syndrome computation result ($S_2$) may be corresponding to the sum of column vectors (for example, second and fourth column vectors), which is corresponding to errors $e_2$ among the column vectors of the parity check matrix (H), as expressed by Equation (4).

$$S_2 = H \cdot e_2 = H \cdot \begin{bmatrix} 0 \\ 1 \\ 0 \\ 1 \\ 0 \\ 0 \\ 0 \end{bmatrix} = \quad \text{Equation (4)}$$

Sum of second and fourth column vectors of $H$

In this case, since the syndrome computation result of the received data is the sum of two or more column vectors, it may be difficult to directly compare the received data to the column vectors included in the parity check matrix. Thus, the first error information generation module 321 may compare, to the column vectors included in the parity check matrix, results obtained by sequentially or arbitrarily subtracting the column vectors included in the parity check matrix from the syndrome computation result of the received data, thereby checking the two column vectors included in the syndrome computation result. When it is checked that the subtraction result corresponds to any one of the column vectors included in the parity check matrix, the checked column vector number and the subtracted column vector number may be determined as the location of error bit(s). In Equation (4) above, only the fourth column vector remains when the second column vector is subtracted from the syndrome computation result $S_2$. The first error information generation module 321 may compare the fourth column vector to the column vectors included in the parity check matrix, and thus check the result that the remaining column vector corresponds to the fourth column vector. Therefore, the first error information generation module 321 may generate the first error information indicating that the number of error bits is 2 and the error bits are located at the second and fourth column vectors.

The second error information generation module 322 may generate second error information by using a first error correction ability, which can detect (and correct) up to K bits of errors per word where K is larger than L. As a specific example, the second error information generation module 322 is capable of detecting up to K bits of errors per word (more bits of errors than the first error correction ability), and generate the second error information based on an error detection result that is obtained by using the second error correction ability. That is, the second error information generation module 322 may generate the second error information by applying the second error detection ability to the received data.

In an embodiment, the second error information generation module 322 may perform a syndrome computation on the data. The second error information generation module 322 may generate a polynomial from the syndrome computation result based on the Berlekamp-Massey algorithm (BMA). The second error information generation module 322 may calculate the roots of the polynomial using the Chien search. Finally, the second error information generation module 322 may generate the second error information indicating the roots of the polynomial as the location of the error bits and the number of the roots as the number of the error bits.

The error information generation control module 323 may control the operations of the first and second error information generation modules 321 and 322. As a specific example, the error information generation control module 323 may control, to generate error information, two or more error information generation modules (e.g., 321, 322, 327, 328) that have different error correction abilities.

In an embodiment, the error information generation control module 323 may control the first and second error information generation modules 321 and 322 (327 and 328) such that the first error information generation module 321 (327) operates before or in parallel to the second error information generation module 322 (328).

In an embodiment, the error information generation control module 323 may control the first and second error information generation modules 321 and 322 such that the first and second error information generation modules 321 and 322 selectively generate error information. As a specific example, the error information generation control module 323 may control the first and second error information generation modules 321 and 322 such that any one of the first and second error information generation modules 321 and 322 generates error information based on error occurrence prediction information. The error occurrence prediction information may indicate information obtained by predicting the number of errors to be included in the received data. The error occurrence prediction information may be decided experimentally or statistically, or decided according to the characteristics of the memory system 120, such as the characteristic of a channel for receiving data or the durability of a place where data are stored.

The syndrome computation module 324 may perform a syndrome computation on the received data. As a specific example, the syndrome computation module 324 may perform a syndrome computation on the received data based on the parity check matrix, and output the result of the syndrome computation.

In an embodiment, when the received data are coded with linear block codes, a multiplication of the parity check matrix H and all codewords C of the linear block codes may yield a zero vector. Thus, the syndrome computation module 324 may output a column vector as the result of the syndrome computation, the column vector corresponding to an erroneous bit in the received data, among the column vectors included in the parity check matrix. That is, when an error is present at the second bit of the received data, the syndrome computation module 324 may output the second column vector of the parity check matrix as the result of the syndrome computation.

The polynomial generation module 325 may generate a polynomial based on the syndrome computation result. As a specific example, when specific column vectors of the parity check matrix are outputted as the syndrome computation result because errors are present in the received data, the polynomial generation module 325 may convert the syndrome computation result into a polynomial. It is obvious that the roots of the polynomial generated on the basis of the syndrome computation result correspond to the positions of the errors, and the number of the roots corresponds to the number of the error bits. That is, when an error is present at the second bit of the received data, the polynomial generation module 325 may generate a polynomial as expressed by Equation (5) below.

$$a_t \cdot \alpha^t + a_{t-1} \cdot \alpha^{t-1} + \ldots + a_1 + 1 \qquad \text{Equation (5)}$$

In an embodiment, the polynomial generation module 325 may generate a polynomial from the syndrome computation result, using the Berlekamp-Massey algorithm (BMA).

For linear block codes, Code c are defined by parity check matrix H. All codewords c∈C satisfy the relationship H·c=0. In some implementations where the second error information generation module 328 decodes the data using Bose, Chaudhri, Hocquenghem (BCH) codes or Reed-Solomon (RS) codes, the parity check matrix of t-error correcting BCH and RS can be express by Matrix (1) above.

For decoding of BCH and RS codes, the second error information generation module 328 utilizes Berlekamp-Massey Algorithm (BMA) to derive the error locator polynomial from the syndrome s=H·r. The BMA, however, induces a large latency in a case t is large.

The technology disclosed in this patent document can be implemented in embodiments to provide a storage device that includes two or more error correction algorithms with different error correction capabilities to reduce the time for error detection and correction in a small t situation. In some embodiments of the disclosed technology, the first error information generation module 327 can be used in parallel with the second error information generation module 328 to detect such a "small" (e.g., t=1,2,3) number of error bits and finish the error detection process even before the BMA and Chien search of the second error information generation module 328 is completed.

Example 1: Single-Bit Error Detection

For BCH and RS codes, a single error can be detected based on the syndrome since the syndrome is corresponding to the column combination of erroneous column of H. Here, the erroneous column can be identified by finding a column that includes any erroneous bit or symbol.

For binary BCH codes, an error bit is always "1." Thus, if a single bit error occurs, the syndrome would be a specific column of H. For RS codes, when a single bit error occurs, the syndrome is express as:

$$s = \begin{bmatrix} e \cdot \alpha^x \\ e \cdot \alpha^{2x} \\ e \cdot \alpha^{3x} \\ \vdots \\ e \cdot \alpha^{2tx} \end{bmatrix} = \begin{bmatrix} \alpha^{x+y} \\ \alpha^{2x+y} \\ \alpha^{3x+y} \\ \vdots \\ \alpha^{2tx+y} \end{bmatrix} \quad \text{Equation (5)}$$

When a single bit error occurs, the sequence of the power of syndrome forms arithmetic progression. Therefore, the first error information generation module 327 can detect the single bit error based on the sequence of power of syndrome.

Example 2: Double-Bit Error Detection

For binary BCH codes, the error bit is always "1." Thus, if a double-bit error occurs, the syndrome can be expressed as a sum of two distinct columns of H. Let $h_i$ be the i-th column of H. Then $s=h_i+h_j$, ... $0 \leq i \neq j \leq n-1$. In an implementation, a double-bit error can be detected by the following steps: (1) calculate $\bar{s}=s-h_k$, ... $0 \leq k \leq n-1$; (2) test the single error detection method with $\bar{s}$ (arithmetic progression). In another implementation, where $s=h_i+h_j$, ... $0 \leq i \neq j \leq n-1$, a double-bit error can be detected by the following steps: (1) find i and j on the assumption of a double-bit error using, e.g., Peterson's algorithm; (2) if $\bar{s}=s-\bar{h}_i-\bar{h}_j=0$, a double-bit error can be determined.

For RS codes, an error symbol is allowed. Thus, if a double-bit error occurs, the syndrome is a linear combination of two distinct column of H. Let $h_i$ be the i-th column of H. $s=\alpha\_i\ h\_i+\alpha\_j\ h\_j$, ... $0 \leq i \neq j \leq n-1$, where $\alpha\_i, \alpha\_j \in GF(q)$. In an implementation, a double-bit error can be detected by the following steps: (1) calculate $\bar{s}=s-\alpha_k h_k$, ... $0 \leq k \leq n-1$, $\mathring{A}\alpha_k \in GF(q)$; (2) test the single error detection method with $\bar{s}$ (arithmetic progression). In another implementation, where $s=\alpha_i h_i+\alpha_j h_j$, ... $0 \leq i \neq j \leq n-1$, where $\alpha_i, \alpha_j \in GF(q)$, a double-bit error can be detected by the following steps: (1) Find i and j on the assumption of a double-bit error, using a Peterson's algorithm; (2) calculate $\bar{s}=s-\alpha_k \bar{h}_j$ (or $\alpha_k \bar{h}_i$), ... $\mathring{A}\alpha_k \in GF(q)$; (3) test the single error detection method with $\bar{s}$ (arithmetic progression).

The first error information generation module 321 may generate the first error information based on the syndrome computation result. As a specific example, the first error information generation module 321 may check the number of the column vectors and the respective column vector numbers by the syndrome computation result from one or more of the syndrome computation result and the polynomial generated on the basis of the syndrome computation result. The first error information generation module 321 may generate the first error information indicating that the number of the column vectors is the number of the errors and the checked column vector numbers are the positions of the errors.

In an embodiment, when a single-bit error occurs in the received data, the first error information generation module 321 (or 327) may check a column vector number corresponding to the syndrome computation result, based on the geometric ratios of the respective column vectors in the parity check matrix. That is, since the respective column vectors of the parity check matrix have different geometric ratios, the first error information generation module 321 (or 327) may check the syndrome computation result or the number of a column vector having a geometric ratio corresponding to the multiplying factor between the respective terms of the polynomial generated on the basis of the syndrome computation result, and generate the first error information containing the checked column vector number as the position of the error. That is, when the error of the data is present at the second bit as shown in Matrix (1) above, the syndrome computation result or the polynomial generated on the basis of the syndrome computation result may be expressed as Equation (1) above. The multiplying factor between the respective terms of the polynomial is a which is equal to the geometric ratio of the second column vector of the parity check matrix. Therefore, the first error information generation module 321 may generate the first error information including information indicating that a signal error bit has occurred at the second bit of the received data. In an embodiment, when two or more error bits have occurred in the received data, the first error information generation module 321 may additionally perform an operation for checking the corresponding column vector numbers. For example, when two column vectors are outputted as a syndrome computation result in case that a double-bit error has occurred, the first error information generation module 321 may sequentially or arbitrarily subtract the respective column vectors of the parity check matrix from the syndrome computation result, and thus check whether the results form a geometric progression. Since the results of the subtraction operations form a geometric progression, the first error information generation module 321 (or 327) may generate the first error information indicating that column vector numbers are the positions of the errors, the column vector numbers being checked based on the column vector numbers of the matrix used for the subtraction operations and the column vectors having a geometric ratio corresponding to the results of the subtraction operations.

The second error information generation module 322 (or 328) may generate the second error information based on the syndrome computation result. As a specific example, the second error information generation module 322 (or 328) may search for the syndrome computation result or the roots of the polynomial generated on the basis of the syndrome computation result. The second error information generation module 322 (or 328) may generate the second error information indicating that the searched roots are the positions of the errors and the number of the roots is the number of the errors.

In an embodiment, the second error information generation module 322 may use the Chien search to search for the roots of the polynomial.

The error information generation control module 323, 329 may control the operations of the syndrome computation module 324, 326, the polynomial generation module 325 and the first and second error information generation modules 321, 327 and 322, 328 in order to generate the error information.

The error correction component 330 may correct the errors of the data. As a specific example, the error correction component 330 may correct the errors of the data based on the error information.

The output component 340 may output the data processed in the error correction apparatus 230. As a specific example, when errors occur in the received data, the output component 340 may output corrected data which have been corrected based on the error information. Furthermore, the output component 340 may output data with no errors as it is received from the input component 310. The data outputted from the output component 340 may be stored in the data buffer, and the data stored in the data buffer may be transferred to the host device through the host I/F.

By way of example and not by limitation, FIGS. 3A and 3B illustrate the error information generation component 320 as including the first and second error information generation modules 321, 327 and 322, 328 to provide the error information. In other implementations, the error information generation component 320 may include three or more error information generation modules having different error detection abilities.

Figure 4:
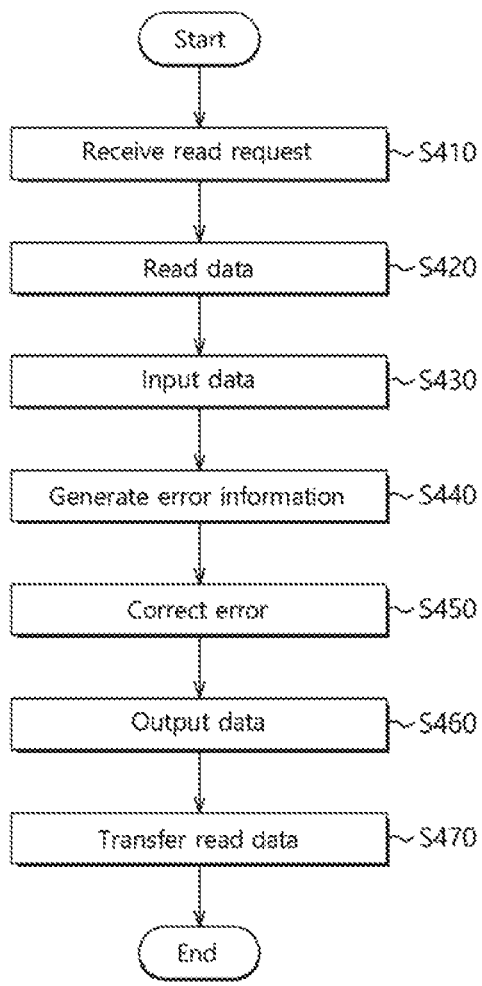
FIG. 4 is a flowchart illustrating an error correction method based on an embodiment of the disclosed technology.

FIG. 4 is a flowchart illustrating an error correction method based on an embodiment of the disclosed technology.

Hereafter, the error correction method will be described with reference to FIGS. 1 to 3B.

Referring to FIG. 4, the host 110 may transfer a read request for data stored in the memory system 120 to the memory system 120 in step S410. The controller 121 of the memory system 120 may receive the read request of the host 110 through the host I/F 240.

In step S420, the controller 121 may transfer a control signal to the memory device 122 through the memory I/F 250, in order to control the memory device 122 to read data corresponding to the read request of the host 110. Thus, the memory device 122 may read the data corresponding to the read request of the host 110, and transfer the read data to the controller 121.

In step S430, the controller 121 may receive the read data from the memory device 122 through the memory I/F 250. The controller 121 may temporarily store the received read data in the memory 220. The controller 121 may input the read data temporarily stored in the memory 220 to the error correction apparatus 230, in order to perform error correction and decoding on the read data temporarily stored in the memory 220. Thus, the error correction apparatus 230 may receive the read data temporarily stored in the memory 220.

In step S440, the error correction apparatus 230 may generate error information. As a specific example, the error correction apparatus 230 may generate error information including the number of errors and the positions of the errors by applying error detection abilities corresponding to the errors of the data. That is, the error correction apparatus 230 may generate the error information based on L error detection abilities applied to data having L or less errors and K error detection abilities applied to data having errors more than L and equal to or less than K, where L is a positive integer and K is an integer larger than L.

In step S450, the error correction apparatus 230 may correct the errors. As a specific example, the error correction apparatus 230 may correct the errors of the data based on the error information. Furthermore, the error correction apparatus 230 may perform error correction and decoding on the read data.

In step S460, the error correction apparatus 230 may output the corrected data. That is, the error correction apparatus 230 may store original data in the memory 220, the original data corresponding to the read data on which the error correction and decoding have been performed.

In step S470, the controller 121 may transfer the original data stored in the memory 220 to the host 110 through the host I/F 240.

Figure 5:
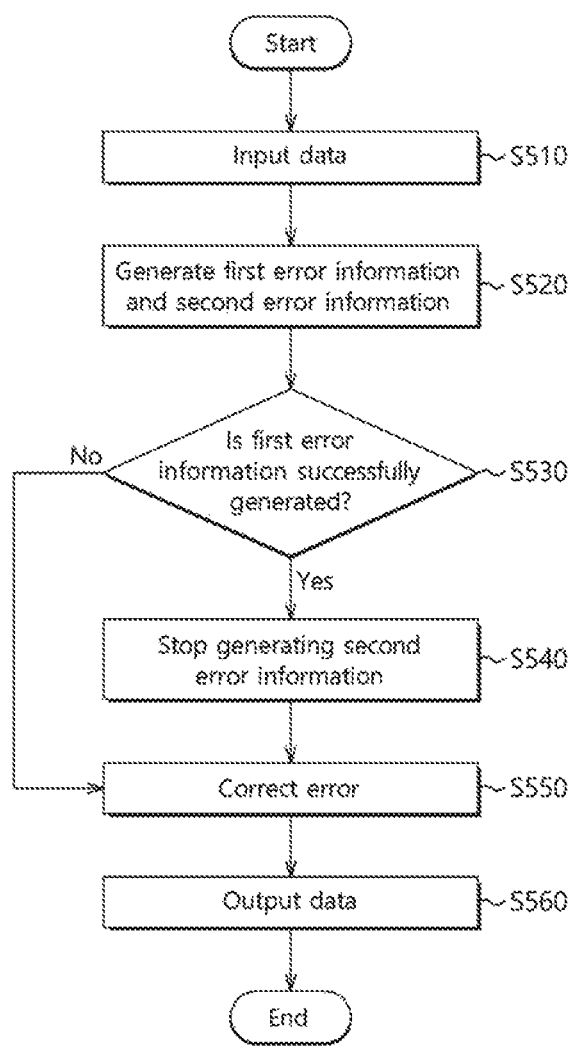
FIG. 5 is a flowchart illustrating an error correction method based on an embodiment of the disclosed technology.

FIG. 5 is a flowchart illustrating an error correction method based on an embodiment of the disclosed technology.

The following descriptions will be based on an example in which the error correction method is performed by the memory system 120 illustrated in FIG. 1. Furthermore, since steps S510 and S560 are performed in the same manner as steps S410 and S440 in FIG. 4, the descriptions thereof will be omitted herein.

Referring to FIG. 5, the memory system 120 may start an operation of generating first error information and second error information in step S520. As a specific example, the memory system 120 may apply two or more error detection (and correction) algorithm with different error detection abilities to decode input data in parallel, generating the first error information and the second error information including the number of errors and the positions of the errors.

In an embodiment, the memory system 120 may perform, on the input data, the operation of generating the first error information with a first error correction ability to detect (and correct) up to L bits of errors per word and the operation of generating the second error information with a second error correction ability to detect (and correct) up to K bits of errors per word in parallel.

In step S530, the memory system 120 may check whether the first error information has been generated. As a specific example, the memory system 120 may check whether the first error information by the first error detection ability has been generated. Since the first error detection ability is lower than the second error detection ability (L is smaller than K), the first error information may be generated before the second error information is generated. Furthermore, when the first error information is not generated, it may indicate that the number of error bits occurred in the data exceeds the maximum number of correctable error bits of the first error detection ability. Thus, the second error information by the second error detection ability may be generated.

In step S540, the memory system 120 may stop the operation of generating the second error information. As a specific example, when the first error information by the first error detection ability is successfully generated, the memory system 120 may terminate the error detection by the second error detection ability without generating the second error information. In general, the error detection operation by the second error detection ability higher than the first error detection ability may require a larger amount of time to complete the detection than the error detection operation by the first error detection ability. Therefore, when the first error information is successfully generated, the second error information does not need to be generated. Thus, the memory system 120 may terminate the operation of generating the second error information.

In step S550, the memory system 120 may correct the errors based on the first error information. As a specific example, the memory system 120 may correct the erroneous bits in the data based on the first error information. For example, when the first error information is successfully generated, that is, when there are L or less errors (e.g., L or less error bits per word), the memory system 120 may correct the erroneous data based on the first error information.

In step S550, the memory system 120 may generate the second error information. As a specific example, when the number of error bits in the input data exceeds the maximum number of correctable error bits by the first error detection ability, the memory system 120 may continue to proceed with the generation of the second error information based on the second error detection ability, because the generation of the first error information failed.

The memory system 120 may correct the errors based on the second error information. As a specific example, the memory system 120 may correct the erroneous input data based on the second error information generated by the second error detection ability. For example, when the generation of the first error information fails, that is, when the number of error bits in the input data exceeds the maximum number of correctable error bits (L), the memory system 120 may correct the errors of the data based on the second error information.

In step S560, the memory system 120 may output the corrected data obtained by correcting the errors of the input data.

Figure 6:
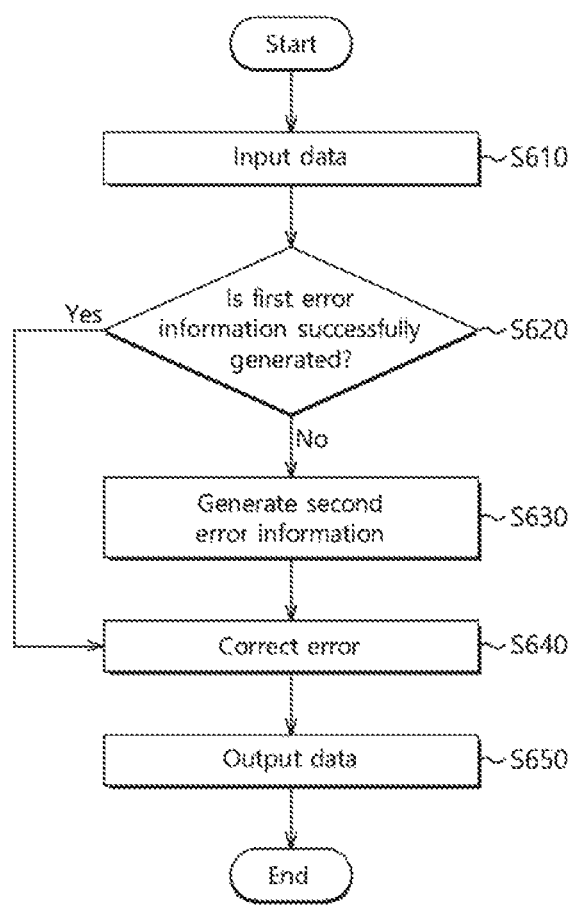
FIG. 6 is a flowchart illustrating an error correction method based on an embodiment of the disclosed technology.

FIG. 6 is a flowchart illustrating an error correction method based on an embodiment of the disclosed technology.

The following descriptions will be based on an example in which the error correction method is performed by the memory system 120 illustrated in FIG. 1. Furthermore, since steps S610 and S650 are performed in the same manner as steps S410 and S440 in FIG. 4, the descriptions thereof will be omitted herein.

Referring to FIG. 6, the memory system 120 may check whether the first error information has been generated, in step S620. As a specific example, any one of different error detection abilities may take priority over other error detection abilities in proceeding to detect errors. For example, the memory system 120 may generate error information by preferentially applying any one of different error detection abilities.

In an embodiment, the memory system 120 may perform an operation of generating the first error information by preferentially applying the first error detection ability (L maximum error bits) less than the second error detection ability (1 maximum error bits).

In step S630, the memory system 120 may generate the second error information. As a specific example, when the memory system 120 fails to generate the first error information by applying the first error detection ability as more than L error bits are present in the data, the memory system 120 may generate the second error information by applying the second error detection ability to detect up to K error bits (K is larger than L).

In step S640, the memory system 120 may correct the errors. As a specific example, when the first error information is successfully generated by the preferentially applied error detection ability, the memory system 120 may correct the errors of the data based on the first error information. Furthermore, when the generation of the first error information by the preferentially applied error detection ability fails, the memory system 120 may correct the errors of the data based on the second error information.

Figure 7:
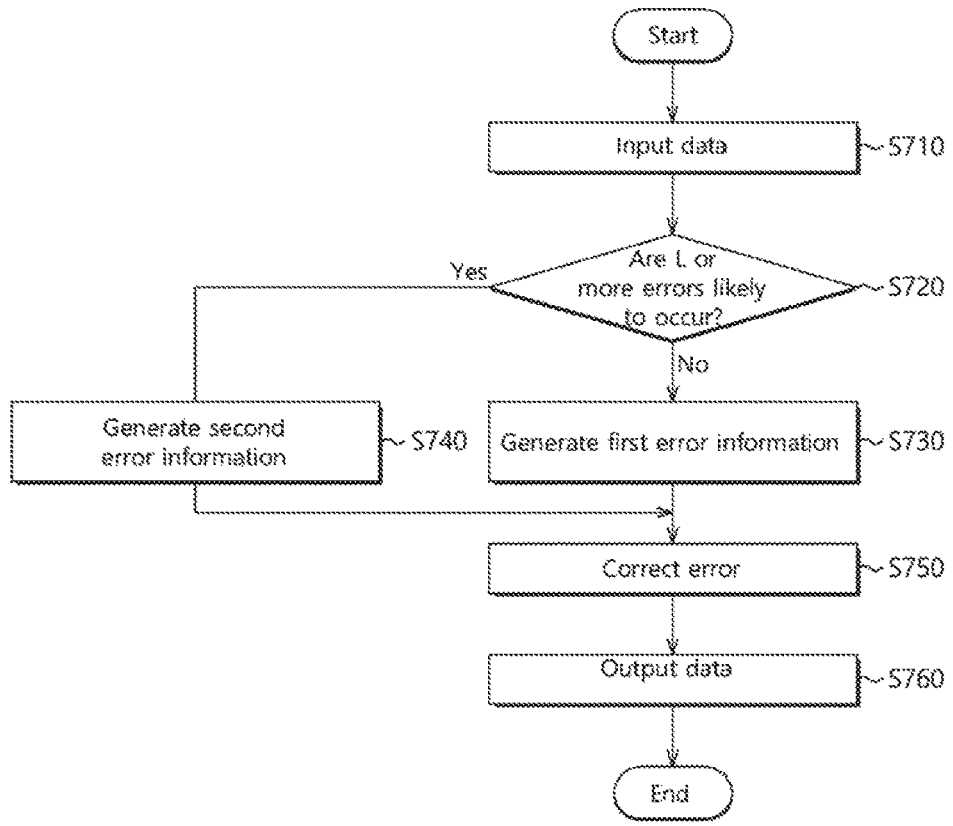
FIG. 7 is a flowchart illustrating an error correction method based on an embodiment of the disclosed technology.

FIG. 7 is a flowchart illustrating an error correction method based on an embodiment of the disclosed technology.

The following descriptions will be based on an example in which the error correction method is performed by the memory system 120 illustrated in FIG. 1. Furthermore, since steps S710 and S760 are performed in the same manner as steps S410 and S440 in FIG. 4, the descriptions thereof will be omitted herein.

Referring to FIG. 7, the memory system 120 may determine the possibility that errors will occur, in step S720. As a specific example, the memory system 120 may predict the number of error bits that can occur in input data, based on error occurrence prediction information.

In an embodiment, the memory system 120 with L-bit error detection ability and K-bit error detection ability may predict whether the number of error bits in the input data would exceed L.

In step S730, the memory system 120 may generate the first error information. As a specific example, when it is expected that L or less error bits will occur in the input data, the memory system 120 may generate the first error information by applying the L-bit error detection ability.

In step S740, the memory system 120 may generate the second error information. As a specific example, when more than L error bits is expected to occur in the input data, the memory system 120 may generate the second error information by applying the K-bit error detection ability to detect more than L error bits.

In step S750, the memory system 120 may correct the errors. As a specific example, when it is expected that L or less error bits will occur, the memory system 120 may correct the errors of the data based on the first error information. Furthermore, when it is determined that more than L error bits will occur, the memory system 120 may correct the errors of the data based on the second error information.

By way of example and not by limitation, the above-described methods use the L-bit error detection abilities and the K-bit error detection abilities. In other implementations, more than two error detection abilities can be used.

Figure 8:
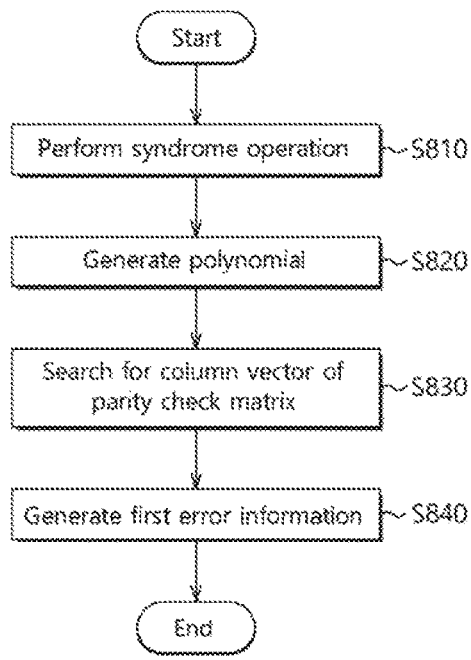
FIG. 8 is a flowchart illustrating an error detection method based on an embodiment of the disclosed technology.

FIG. 8 is a flowchart illustrating an error detection method based on an embodiment of the disclosed technology.

The following descriptions will be based on an example in which the error detection method is performed by the memory system 120 illustrated in FIG. 1.

Referring to FIG. 8, the memory system 120 may perform a syndrome computation in step S810. As a specific example, the memory system 120 may perform the syndrome computation on input data based on the parity check matrix.

In step S820, the memory system 120 may generate a polynomial. As a specific example, the memory system 120 may generate a polynomial based on the result of the syndrome computation on the input data. The roots of the generated polynomial may indicate the positions of errors, and the number of the roots may indicate the number of the errors.

In an embodiment, the memory system 120 may generate the polynomial from the syndrome computation result, using the Berlekamp-Massey algorithm (BMA).

In step S830, the memory system 120 may search for a column vector. As a specific example, the memory system 120 may search for a column vector of the parity check matrix, corresponding to the syndrome computation result or the polynomial generated on the basis of the syndrome computation result.

In an embodiment, the memory system 120 may search for a column vector of the parity check matrix, corresponding to the syndrome computation result or the polynomial generated on the basis of the syndrome computation result, based on the geometric ratios of column vectors included in the parity check matrix.

In an embodiment, when one-bit error (first or second error) occurs in the data, the memory system 120 may check a vector having the same geometric ratio as the multiplying factor between the respective terms of the syndrome computation result or the polynomial generated on the basis of the syndrome computation result, among the column vectors included in the parity check matrix.

In an embodiment, when two-bit errors occur in the data, the memory system 120 may perform an operation of subtracting the respective column vectors included in the parity check matrix from the syndrome computation result or the polynomial generated on the basis of the syndrome computation result. When the memory system 120 performs the subtraction operation such that each of the terms of the syndrome computation result or the polynomial generated on the basis of the syndrome computation result has a specific multiplying factor, the number of a column vector having the same geometric ratio as the specific multiplying factor and the column vector number where the subtraction operation has been performed may correspond to the positions of the errors.

In step S840, the memory system 120 may generate the first error information. As a specific example, the memory system 120 may generate the first error information including information indicating that the number of column vectors corresponding to the syndrome computation result or the polynomial generated on the basis of the syndrome computation result is the number of errors and the column vector numbers are the positions of the errors.

Figure 9:
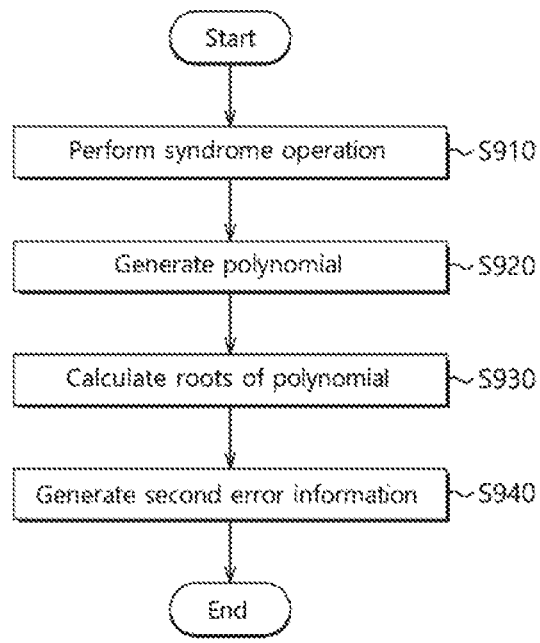
FIG. 9 is a flowchart illustrating an error detection method based on an embodiment of the disclosed technology.

FIG. 9 is a flowchart illustrating an error detection method based on an embodiment of the disclosed technology.

The following descriptions will be based on an example in which the error detection method is performed by the memory system 120 illustrated in FIG. 1. Furthermore, since steps S910 and S920 are performed in the same manner as steps S810 and S820 in FIG. 8, the descriptions thereof will be omitted herein.

Referring to FIG. 9, the memory system 120 may calculate the roots of a polynomial in step S930. As a specific example, the memory system 120 may perform an operation of calculating the roots of the polynomial generated on the basis of the syndrome computation result.

In an embodiment, the memory system 120 may use the Chien search to search for the roots of the polynomial.

In step S940, the memory system 120 may generate the second error information. As a specific example, the memory system 120 may generate the second error information including information indicating that the calculated roots are the positions of errors and the number of the roots is the number of the errors.

Referring back to FIG. 1, the memory device 122 may include a plurality of memory blocks 120a, 120b and 120c. Each of the memory blocks 120a, 120b and 120c may include a plurality of pages. Each of the pages may include a plurality of memory cells to which a plurality of word lines is coupled. The memory device 122 may include a plurality of planes each including the plurality of memory blocks 120a, 120b and 120c. In particular, the memory device 122 may include a plurality of memory dies each including the plurality of planes. In an embodiment, the memory device 122 may be implemented as a nonvolatile memory device such as a flash memory. The flash memory may have a three-dimensional (3D) stack structure. Hereafter, the memory device 122 will be described in detail below with reference to FIGS. 10 to 13.

Figure 10:
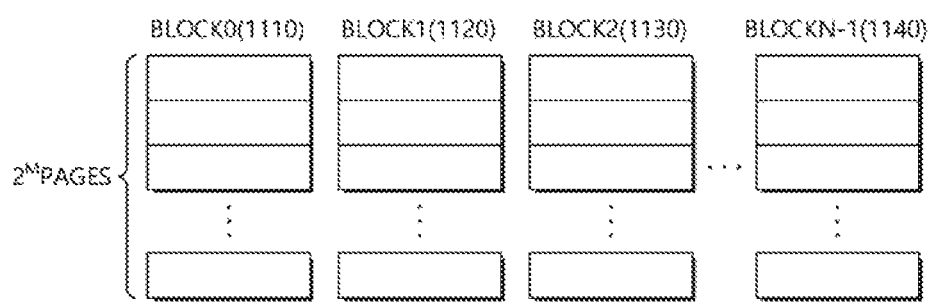
FIG. 10 is a diagram schematically illustrating a memory device based on an embodiment of the disclosed technology.

FIG. 10 is a diagram schematically illustrating a memory device based on an embodiment of the disclosed technology.

Referring to FIG. 10, the memory device 122 may include a plurality of memory blocks, for example, a block BLK (Block)0 1110, a block BLK1 1120, a block BLK2 1130 and a block BLKN-1 1140, and each of the blocks 1110, 1120, 1130 and 1140 may include a plurality of pages, for example, $2^M$ pages $2^M$PAGES. For convenience of description, it will be exemplified that each of the memory blocks includes $2^M$ pages. However, each of the memories may include M pages. Each of the pages may include a plurality of memory cells to which a plurality of word lines are coupled.

The plurality of memory blocks included in the memory device 122 may be divided into single level cell (SLC) memory blocks and multi-level cell (MLC) memory blocks, depending on the number of bits which can be stored in or expressed by one memory cell. The SLC memory block may include a plurality of pages which are implemented by memory cells each configured to store one-bit data therein, and have high-speed data computing performance and high durability. The MLC memory block may include a plurality of pages which are implemented by memory cells each configured to store multi-bit data (for example, two or more-bit data) therein, and have a larger data storage space than the SLC memory block. In other words, the MCL memory block may be integrated at higher density than the SLM memory block. In particular, the memory device 122 may include, as the MLC memory block, a triple level cell (TLC) memory block, a quadruple level cell (QLC) memory block or a multiple-level-cell memory block as well as the MLC memory block including a plurality of pages which are implemented by memory cells each capable of storing two-bit data therein. The TLC memory block may include a plurality of pages which are implemented by memory cells each capable of storing three-bit data therein, the QLC memory block may include a plurality of pages which are implemented by memory cells each capable of storing four-bit data therein, and the multiple-level-cell memory block may include a plurality of pages which are implemented by memory cells each capable of storing five or more-bit data therein.

Each of the blocks 1110, 1120, 1230 and 1140 may store data provided from the host 110 through a write operation, and provide data stored therein to the host 110 through a read operation.

Figure 11:
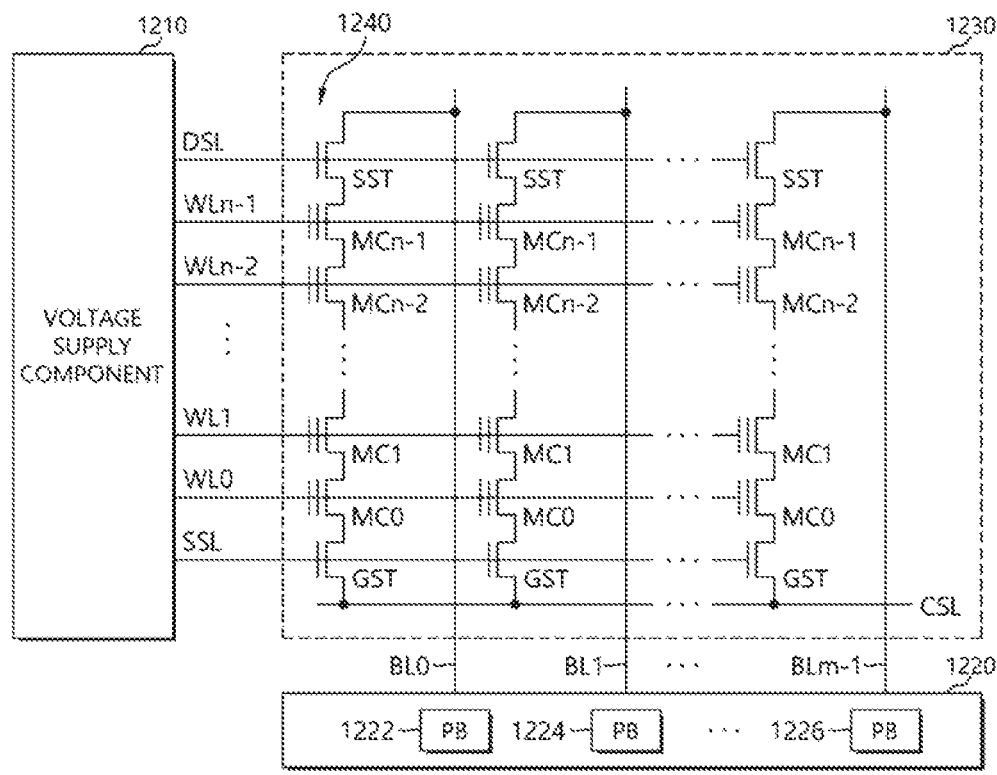
FIG. 11 is a diagram schematically illustrating a cell array circuit of the memory device based on some embodiments of the disclosed technology.

FIG. 11 is a diagram schematically illustrating a cell array circuit of the memory device based on the present embodiment.

Referring to FIG. 11, each memory block 1230 among the plurality of memory blocks 120a, 120b and 120c included in the memory device 122 of the memory system 120 may include a plurality of cell strings 1240 which are implemented as a memory cell array and coupled to a plurality of bit lines BL0 to BLm-1, respectively. The cell string 1240 of each column may include one or more drain select transistors DST and one or more source select transistors SST. Between the select transistors DST and SST, a plurality of memory cells or memory cell transistors MC0 to MCn-1 may be coupled in series. Each of the memory cells MC0 to MCn-1 may be configured as an MLC capable of storing multiple-bit data information therein. The cell strings 1240 may be electrically coupled to the corresponding bit lines BL0 to BLm-1.

FIG. 11 illustrates the memory block 1230 including NAND flash memory cells. However, each of the memory blocks 120a, 120b and 120c included in the memory device 122 based on the present embodiment is not limited to a NAND flash memory, but may be implemented as a NOR-type flash memory, a hybrid flash memory having two or more types of memory cells mixed therein, or a one-NAND flash memory having a controller embedded in a memory chip. Furthermore, the memory device 122 based on the present embodiment may also be implemented as a flash memory device having a charge storage layer formed of a conductive floating gate or a charge trap flash (CTF) memory device having a charge storage layer formed of a dielectric layer.

A voltage supply component of the memory device 122 may provide word line voltages (for example, write voltages, read voltages and pass voltages) to be supplied to the respective word lines and a voltage to be supplied to a bulk (for example, well region) where memory cells are formed, depending on an operation mode. The voltage generation operation of the voltage supply component 1210 may be performed under control of a control circuit (not illustrated). The voltage supply component 1210 may generate a plurality of variable read voltages to generate a plurality of read data. In response to control of the control circuit, the voltage supply component 1210 may select one of the memory blocks (or sectors) of the memory cell array, select one of the word lines of the selected memory block, and provide word line voltages to the selected word line and the unselected word lines, respectively.

A read/write circuit 1220 of the memory device 122 may be controlled by the control circuit, and operate as a sense amplifier or write driver depending on an operation mode. For example, in case of a verification/normal read operation, the read/write circuit 1220 may operate as a sense amplifier for reading data from the memory cell array. In case of a write operation, the read/write circuit 1220 may operate as a write driver for driving bit lines according to data to be stored in the memory cell array. The read/write circuit 1220 may receive data to be stored in the memory cell array from a buffer (not illustrated), and drive bit lines according to the received data, during the write operation. For this operation, the read/write circuit 1220 may include a plurality of page buffers (PB) 1222, 1224 and 1226 corresponding to columns or column pairs, respectively, and each of the page buffers 1222, 1224 and 1226 may include a plurality of latches (not illustrated).

Figure 12:
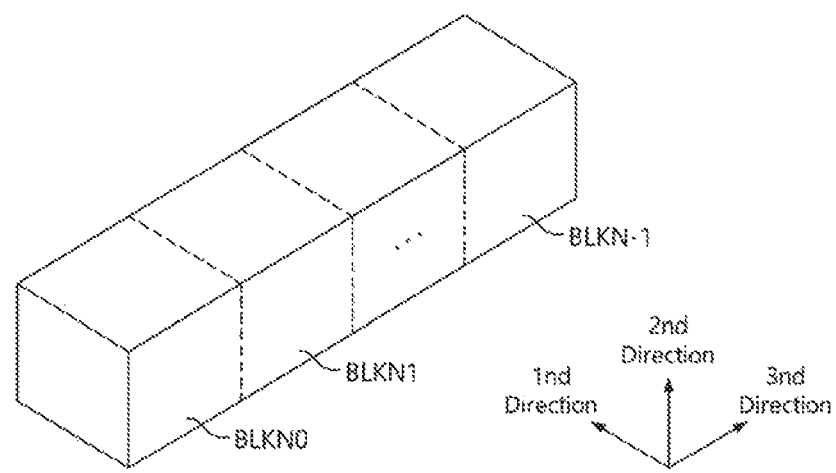
FIG. 12 is a diagram for describing an example of a 3D stack structure of the memory device based on some embodiments of the disclosed technology.

FIG. 12 is a diagram for describing a 3D stack structure of the memory device based on the present embodiment.

Referring to FIG. 12, the memory device 122 may be implemented as a 2D or 3D memory device. In particular, as illustrated in FIG. 12, the memory device 122 may be implemented as a nonvolatile memory device having a 3D stack structure. When the memory device 122 is implemented as a nonvolatile memory device having a 3D stack structure, the memory device 122 may include a plurality of memory blocks BLK0 to BLKN-1. FIG. 12 is a block diagram illustrating the memory blocks 120a, 120b and 120c of the memory device 122 illustrated in FIG. 1, and each of the memory blocks 120a, 120b and 120c may be implemented with a 3D structure (or vertical structure). For example, each of the memory blocks 120a, 120b and 120c may include structures extended in first to third directions, for example, the x-axis direction, the y-axis direction and the z-axis direction, and thus have a 3D structure.

Referring back to FIG. 11, each of the memory blocks 1230 included in the memory device 122 may include a plurality of NAND strings NS extended in the second direction, and the plurality of NAND strings NS may be provided in the first and third directions. Each of the NAND strings NS may be coupled to a bit line BL, one or more string select lines SSL, one or more ground select lines GSL, a plurality of word lines WL, one or more dummy word lines DWL and a common source line CSL, and include a plurality of transistor structures TS.

That is, the memory block 1230 among the memory blocks 120a, 120b and 120c of the memory device 122 may be coupled to a plurality of bit lines BL, a plurality of string select lines SSL, a plurality of ground select lines GSL, a plurality of word lines WL, a plurality of dummy word lines DWL and a plurality of common source lines CSL, and thus include a plurality of NAND strings. Furthermore, in the memory block 1230, a plurality of NAND strings NS may be coupled to one bit line BL, such that a plurality of transistors may be implemented in one NAND string NS. Furthermore, the string select transistor SST of each of the NAND strings NS may be coupled to the corresponding bit line BL, and the ground select transistor GST of each of the NAND strings NS may be coupled to the common source line CSL. Between the string select transistor SST and the ground select transistor GST of each of the NAND strings NS, memory cells MC may be provided. That is, a plurality of memory cells may be implemented in the memory block 1230 of the memory blocks 120a, 120b and 120c of the memory device 122.

It should be noted that for facilitating the understanding of underlying concepts, the disclosed embodiments have been described with reference to "bits," it is understood that the disclosed embodiments are generally applicable to "symbols," which may be binary or non-binary symbols. It should be further noted that in this document, the term error detection algorithm (or an error detecting code) is used to convey an algorithm (or code) that is at least capable of detecting erroneous symbols of a data stream or a data block. It is understood that error correction algorithms and error correction codes are capable of not only detecting the errors, but also correction a particular number of erroneous symbols. In this context, error correction algorithms may be used to detect and/or correct erroneous symbols. Therefore, these algorithms are sometimes referred to interchangeably in this document.

In an embodiment of the disclosed technology, a semiconductor memory system includes a memory cell array including a plurality of memory cells to store data; and a controller in communication with the memory cell array. The controller is configured to detect one or more erroneous bits in the data using more than one error detection algorithm, including a first error detection algorithm having a first error detection ability, and a second error detection algorithm having a second error detection ability capable of detecting more erroneous bits than the first error detection algorithm. The second error detection algorithm is configured to terminate the detection of the one or more erroneous bits upon completion of the detection of the one or more erroneous bits by the first error detection ability.

The first error detection algorithm is configured to detect the one or more erroneous bits based on a parity check matrix obtained from the data. For example, the first error detection algorithm may include Peterson algorithm. The second error detection algorithm may include a determination algorithm of an error locator polynomial and finding the roots of the error locator polynomial. The second error detection algorithm may include Berlekamp-Massey algorithm and Chien search.

In an embodiment of the disclosed technology, a semiconductor memory system includes a memory cell array and a controller in communication with the memory cell array to read data from the memory cell array. The controller includes a syndrome generator to calculate a plurality of syndromes for the data, a first error detection algorithm having a first error detection ability to detect one or more erroneous bits in the data, a second error detection algorithm having a second error detection ability capable of detecting more erroneous bits than the first error detection algorithm to detect erroneous bits in the data, and a comparator in communication with the syndrome generator and configured to compare the plurality of syndromes to check whether the plurality of syndromes satisfies a condition for termination of the second error detection algorithm.

In some implementations, the first error detection algorithm can operate first before the second error detection algorithm starts to operate. In other implementations, the first and second error detection algorithms operate in parallel on the data. This is effective where the error detection by the first error detection algorithm is faster than the error detection by the second error detection algorithm. In an example implementation where the computation associated with the second error detection algorithm is very complicated, a simultaneous computation associated with the first and second error correction algorithms can improve the effectiveness of error detection and minimize the time it takes to detect errors. As another example, even if the first error detection algorithm fails to detect/correct the errors because the amount of errors exceeds the error detection/correction capability of the first error correction algorithm, the computation result of the first error detection/correction algorithm can facilitate the process of the second error detection algorithm by providing information as to, e.g., the location of erroneous bits.

The first error detection algorithm may be configured to detect the one or more erroneous bits based on a parity check matrix obtained from the plurality of syndromes. As another example, the first error detection algorithm may include Peterson algorithm.

The second error detection algorithm may include Bose, Chaudhri, Hocquenghem (BCH) codes, and in this case the condition for termination of the second error detection algorithm includes designating a column of the parity check matrix as a syndrome.

The second error detection algorithm includes Reed-Solomon (RS) code, and in this case the condition for termination of the second error detection algorithm includes a sequence of powers of the syndromes that forms arithmetic progression.

The second error detection algorithm may include a determination algorithm of an error locator polynomial. In this case, the first error detection algorithm and the determination algorithm of the error locator polynomial proceed in parallel.

The second error detection algorithm may include determining an error locator polynomial and finding the roots of the error locator polynomial. In this case, the first error detection algorithm and the finding of the roots of the error locator polynomial proceed in parallel.

In another embodiment of the disclosed technology, a semiconductor memory system includes a memory cell array and a controller in communication with the memory cell array to read data from the memory cell array. The controller includes a syndrome generator to calculate a plurality of syndromes for the data, a first error detection algorithm to detect a single-bit error or up to a double-bit error in the data, a second error detection algorithm to detect erroneous bits in the data in parallel with the first error detection algorithm using a cyclic code, and a comparator in communication with the syndrome generator and configured to compare the plurality of syndromes to check whether the plurality of syndromes satisfies a condition for termination of the second error detection algorithm.

The first error detection algorithm may be configured to detect the single-bit error or the double-bit error in the data based on a parity check matrix obtained from the plurality of syndromes or Peterson algorithm. The second error detection algorithm may include Bose, Chaudhri, Hocquenghem (BCH) codes, and wherein the condition for termination of the second error detection algorithm includes finding the single-bit error based on a sequence of powers of the syndromes that forms arithmetic progression.

The second error detection algorithm may include Bose, Chaudhri, Hocquenghem (BCH) codes, and in this case the condition for termination of the second error detection algorithm includes finding the double-bit error based on a sum of two distinct column of a parity check matrix obtained from the plurality of syndromes.

The second error detection algorithm may include Reed-Solomon (RS) code, and in this case the condition for termination of the second error detection algorithm includes finding the single-bit error based on an arithmetic progression of powers of the syndromes that are in a column of a parity check matrix. As another example, the condition for termination of the second error detection algorithm includes finding the double-bit error based on arithmetic progressions of powers of the syndromes that are in two columns of a parity check matrix.

The Berlekamp-Massey algorithm is an algorithm that will find the shortest linear feedback shift register (LFSR) for a given binary output sequence. The algorithm will also find the minimal polynomial of a linearly recurrent sequence in an arbitrary field. The field requirement means that the Berlekamp-Massey algorithm requires all non-zero elements to have a multiplicative inverse.

The Chien search is a fast algorithm for determining roots of polynomials defined over a finite field. The Chien search is commonly used to find the roots of error-locator polynomials encountered in decoding Reed-Solomon codes and BCH codes.

The Reed-Solomon codes operate on a block of data treated as a set of finite field elements called symbols. The Reed-Solomon codes are able to detect and correct multiple symbol errors. By adding t check symbols to the data, a Reed-Solomon code can detect any combination of up to and including t erroneous symbols, or correct up to and including [t/2] symbols.

The Peterson's algorithm (or Peterson's solution) is a concurrent programming algorithm for mutual exclusion that allows two or more processes to share a single-use resource without conflict, using only shared memory for communication.

Based on the present embodiment, it is possible to improve the reliability of data and the efficiency of error correction.

Although various embodiments have been described for illustrative purposes, it will be apparent to those skilled in the art that various changes and modifications may be made without departing from the spirit and scope of the invention as defined in the following claims.

What is claimed is:

1. An error correction apparatus comprising:
an input component configured to receive data;
an error information generation component having a first error detection ability to detect L errors and a second error detection ability to detect K errors, where L is a positive integer and K is an integer larger than L, and configured to generate error information including the number of errors contained in the received data and the positions of the errors, based on the first error detection ability, and generate the error information based on the second error detection ability, when the error information is not generated on the basis of the first error detection ability;
an error correction component configured to correct the errors of the received data based on the generated error information; and
an output component configured to output the corrected data,
wherein the error information generation component is configured to initiate an operation of generating second error information based on the second error detection ability simultaneously with an operation of generating first error information based on the first error detection ability or when the first error information is not generated based on the first error detection ability.

2. The error correction apparatus according to claim 1, wherein the error information generation component comprises:
a first error information generation module configured to generate first error information as the error information by the first error detection ability;
a second error information generation module configured to generate second error information as the error information by the second error detection ability; and
an error information generation control module configured to control the operations of the first and second error information generation modules.

3. The error correction apparatus according to claim 2, wherein when the first and second error information generation modules are operated in parallel to each other, the error information generation control module controls the second error information generation module to stop the operation of the second error information generation module, in the case that the first error information is generated by the first error information generation module and the second error information generation module is being operated.

4. The error correction apparatus according to claim 2, wherein the error information generation component further comprises a syndrome computation module configured to perform a syndrome computation on the received data based on a parity check matrix,
wherein one or more of the first and second error information generation modules generate the error information based on the syndrome computation result.

5. The error correction apparatus according to claim 4, wherein the error information generation component further comprises a polynomial generation module configured to generate a polynomial having the error information as roots based on the syndrome computation result,
wherein one or more of the first and second error information generation modules generate the error information based on the generated polynomial.

6. The error correction apparatus according to claim 5, wherein the first error information generation module generates the first error information based on the number of a column vector of the parity check matrix, the column vector having a geometric ratio corresponding to a multiplying factor between the respective terms of the polynomial.

7. The error correction apparatus according to claim 6, wherein the second error information generation module calculates the roots of the polynomial, and generates the second error information based on the calculated roots.

8. An error correction method comprising the steps of:
receiving data;
generating error information including the number of errors contained in the received data and the positions of the errors based on a first error detection ability to detect L errors, and generating the error information based on a second error detection ability to detect K errors, when the error information is not generated on the basis of the first error detection ability, where L is a positive integer and K is an integer larger than L;
correcting the errors of the received data based on the generated error information; and
outputting the corrected data,
wherein the generating of the error information includes generating first error information based on the first error detection ability and generating second error information based on the second error detection ability, and the generating of the second error information is initiated simultaneously with the generating of the first error information or when the first error information is not generated based on the first error detection ability.

9. The error correction method according to claim 8, wherein in the step of generating the error information,
when L error detection abilities and K error detection abilities are applied in parallel, an operation for generating second error information through the K error detection abilities is stopped in the case that first error information is generated by the L error detection abilities and the operation for generating the second error information is being performed.

10. The error correction method according to claim 9, wherein the step of generating the error information comprises the step of performing a syndrome computation on the received data based on a parity check matrix, and generating the error information by applying one or more of the L error detection abilities and the K error detection abilities to the syndrome computation result.

11. The error correction method according to claim 10, wherein the step of generating the error information comprises the step of generating a polynomial having the error information as roots based on the syndrome computation result, and generating the error information by applying one or more of the L error detection abilities and the K error detection abilities to the generated polynomial.

12. The error correction method according to claim 11, wherein the step of generating the error information by applying the L error detection abilities comprises the step of generating the error information based on the number of a column vector of the parity check matrix, the column vector having a geometric ratio corresponding to a multiplying factor between the respective terms of the polynomial.

13. The error correction method according to claim 12, wherein the step of generating the error information by applying the K error detection abilities comprises the step of calculating the roots of the polynomial, and generating the error information based on the calculated roots.

14. A memory system comprising:
a memory device configured to store data therein according to a write command and output the data stored therein according to a read command; and a controller configured to control the operation of the memory device,
wherein the controller comprises:
a memory interface configured to receive read data corresponding to a read request of a host from the memory device;
a data buffer configured to temporarily store the read data received through the memory interface and corrected data obtained by correcting the read data;
an error correction apparatus having a first error detection ability to detect L errors and a second error detection ability to detect K errors, where L is a positive integer and K is an integer larger than L, and configured to generate error information including the number of errors contained in the read data stored in the data buffer and the positions of the errors, based on the first error detection ability, generate the error information based on the second error detection ability when the error information is not generated on the basis of the first error detection ability, correct the errors of the read data stored in the data buffer based on the generated error information, and temporarily store the corrected read data in the data buffer; and
a host interface configured to transfer the read data temporarily stored in the data buffer to the host,
wherein the error correction apparatus is configured to initiate an operation of generating second error information based on the second error detection ability simultaneously with an operation of generating first error information based on the first error detection ability or when the first error information is not generated based on the first error detection ability.

15. The memory system according to claim 14, wherein the controller comprises:
a first error information generation module configured to generate first error information as the error information by the first error detection ability;
a second error information generation module configured to generate second error information as the error information by the second error detection ability; and
an error information generation control module configured to control the operations of the first and second error information generation modules.

16. The memory system according to claim 15, wherein when the first and second error information generation modules are operated in parallel to each other, the error information generation control module controls the second error information generation module to stop the operation of the second error information generation module, in the case that the first error information is generated by the first error information generation module and the second error information generation module is being operated.

17. The memory system according to claim 15, wherein the error information generation component further comprises a syndrome computation module configured to perform a syndrome computation on the read data stored in the data buffer, based on a parity check matrix,
wherein one or more of the first and second error information generation modules generate the error information based on the syndrome computation result.

18. The memory system according to claim 17, wherein the error information generation component further comprises a polynomial generation module configured to generate a polynomial having the error information as roots based on the syndrome computation result,
wherein one or more of the first and second error information generation modules generate the error information based on the generated polynomial.

19. The memory system according to claim 18, wherein the first error information generation module generates the first error information based on the number of a column vector of the parity check matrix, the column vector having a geometric ratio corresponding to a multiplying factor between the respective terms of the polynomial.

20. The memory system according to claim 19, wherein the second error information generation module calculates the roots of the polynomial, and generates the second error information based on the calculated roots.

* * * * *